United States Patent [19]
Kawagoe

[11] Patent Number: 6,133,752
[45] Date of Patent: Oct. 17, 2000

[54] SEMICONDUCTOR INTEGRATED CIRCUIT HAVING TRI-STATE LOGIC GATE CIRCUIT

[75] Inventor: Masakuni Kawagoe, Miyazaki, Japan

[73] Assignee: Oki Electric Industry Co., Ltd., Tokyo, Japan

[21] Appl. No.: 09/055,988

[22] Filed: Apr. 7, 1998

[30] Foreign Application Priority Data

Sep. 25, 1997 [JP] Japan ................................ 9-259532

[51] Int. Cl.$^7$ ........................................ G06F 7/50
[52] U.S. Cl. ................... 326/55; 326/81; 326/83; 326/88; 326/101
[58] Field of Search ............. 326/56, 57, 58, 326/80, 81, 83, 86, 88, 101, 103; 97/99

[56] References Cited

U.S. PATENT DOCUMENTS 5,489,859  2/1996  Kawaguchi et al. .............. 326/57

OTHER PUBLICATIONS

Scott, An Introduction to Circuit Analysis A Systems Approach, chapter 1, 1987.

*Primary Examiner*—Michael Tokar
*Assistant Examiner*—Anh Tran
*Attorney, Agent, or Firm*—Jones Volentine, L.L.P.

[57] ABSTRACT

The tri-state logic gate circuit is preferably made up of a first inverter circuit which selectively outputs one of the power supply voltage and a ground potential, a second inverter circuit which selectively outputs one of the first inverter circuit output and the boosted power supply voltage, a resistor connected between the first and second inverter circuits, and a latch circuit. Accordingly, the tri-state logic gate circuit can avoid latch-up.

18 Claims, 12 Drawing Sheets

SEMICONDUCTOR INTEGRATED CIRCUIT HAVING TRI-STATE LOGIC GATE CIRCUIT

BACKGROUND OF THE INVENTION

1. Field of the Invention

The present invention generally relates to a semiconductor integrated circuit. More particularly, the present invention relates to dynamic random access memories (DRAMs) having a tri-state logic gate circuit using a boosted power supply voltage.

This application is a counterpart of Japanese application Serial Number 259532/1997, filed Sep. 25, 1997, the subject matter of which is incorporated herein by reference.

2. Description of the Related Art

FIG. 1 is a schematic diagram showing circuitry according to a conventional DRAM circuit.

The DRAM has circuitry to control the transfer of the stored data from memory cell arrays 100 to sense amplifiers 101, amplifies the transferred result, and outputs the result, by switching each of transfer gates 102 in response to timing signals applied from tri-state logic gate circuits 103.

FIG. 2 is a schematic diagram showing a tri-state logic gate circuit 103 according to a conventional DRAM circuit.

As shown in FIG. 2, the tri-state logic gate circuit 103 is made up of two inverter circuits and a latch circuit. A first inverter circuit includes a P-channel MOS transistor P1 and an N-channel MOS transistor N1. A second inverter circuit includes a P-channel MOS transistor P2 and an N-channel MOS transistor N2. The latch circuit includes P-channel MOS transistors P3 and P4 and N-channel MOS transistors N3 and N4. The tri-state logic gate circuit 103 controls a switching operation between a boosted power supply voltage SBOOST and two other power supply voltages $V_{cc}$ and $V_{ss}$ in response to a set signal A. The tri-state logic gate circuit 103 also controls a switching operation between a power supply voltage $V_{cc}$ and a ground potential $V_{ss}$ in response to a reset signal A'. Therefore, the tri-state logic gate circuit 103 selectively outputs the boosted power supply voltage SBOOST, the power supply voltage $V_{cc}$, and the ground potential $V_{ss}$. The boosted power supply voltage SBOOST is a voltage using as a gate signal of the transfer gates 102, and which is generated in an internal integrated circuit based on the power supply voltage $V_{cc}$. Further, the boosted power supply voltage SBOOST is $V_{cc}+Vt+\alpha$ boosted in order to transfer charges of bit lines to the sense amplifier 101. FIG. 3 is a timing chart showing an operation of a tri-state logic gate circuit according to a conventional DRAM circuit.

The memory cell access operation is as follows.

The reset signal A' maintains an H level. The set signal A maintains an L level. At this time, a P-channel MOS transistor P1 turns off, an N-channel MOS transistor N1 turns on, a P-channel MOS transistor P2 turns on, and an N-channel MOS transistor N2 turns off. As a result, a timing signal TG changes to a level of the boosted power supply voltage SBOOST. Accordingly, the transfer gate 102a turns on, the transfer gate 102b turns off, and bit lines are capable of connecting to the sense amplifier 101. And then, the sense amplifier 101 starts to operate.

The precharge operation is as follows.

The reset signal A' maintains an L level. The set signal A maintains an H level. At this time, a P-channel MOS transistor P1 turns on, an N-channel MOS transistor N1 turns off, a P-channel MOS transistor P2 turns off, and an N-channel MOS transistor N2 turns on. As a result, a level of a timing signal TG becomes a level of the power supply voltage $V_{cc}$.

When the memory cell aren't selected, both of the reset signal A' and the set signal A maintain an H level. As a result, a level of a timing signal TG becomes a level of the ground potential $V_{ss}$.

Here, back-biases of the P-channel MOS transistors P1 and P2 are the boosted power supply voltage SBOOST, respectively. This reason is that a voltage tolerance of the P-channel MOS transistors P1 and P2 are concerned.

SUMMARY OF THE INVENTION

An object of the present invention is to provide a tri-state logic gate circuit that can avoid latch-up.

According to one aspect of the present invention, for achieving the above object, there is provided a tri-state logic gate circuit comprising: a first inverter circuit selectively outputting one of a power supply voltage and a ground potential; a second inverter circuit selectively outputting one of an output of the first inverter circuit and a boosted power supply voltage; and a resistor connected between the first and second inverter circuits.

According to another aspect of the present invention, for achieving the above object, there is provided a tri-state logic gate circuit comprising: a first inverter circuit being a bootstrap circuitry, the first inverter circuit selectively outputting one of a power supply voltage and a ground potential; and a second inverter circuit selectively outputting one of an output of the first inverter circuit and a boosted power supply voltage.

According to another aspect of the present invention, for achieving the above object, there is provided a tri-state logic gate circuit comprising: a latch circuit; a first inverter circuit selectively outputting one of a power supply voltage and a ground potential; a second inverter circuit selectively outputting one of an output of the first inverter circuit and a boosted power supply voltage and inputting an output of the latch circuit; and a resistor connected between the first and second inverter circuits.

According to another aspect of the present invention, for achieving the above object, there is provided a pair of first and second tri-state logic gate circuits comprising: a first tri-state logic gate circuits including a first inverter circuit selectively outputting one of a power supply voltage and a ground potential, and a second inverter circuit selectively outputting one of an output of the first inverter circuit and a boosted power supply voltage; a second tri-state logic gate circuits including a third inverter circuit selectively outputting one of the power supply voltage and the ground potential, and a fourth inverter circuit selectively outputting one of an output of the third inverter circuit and the boosted power supply voltage; the first inverter circuit operating using a driving signal of the fourth inverter circuit; and the third inverter circuit operating using a driving signal of the second inverter circuit.

BRIEF DESCRIPTION OF THE DRAWINGS

While the specification concludes claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A semiconductor integrated circuit device according to a first preferred embodiment of a present invention will hereinafter be described in detail with FIG. 4.

Figure 4:
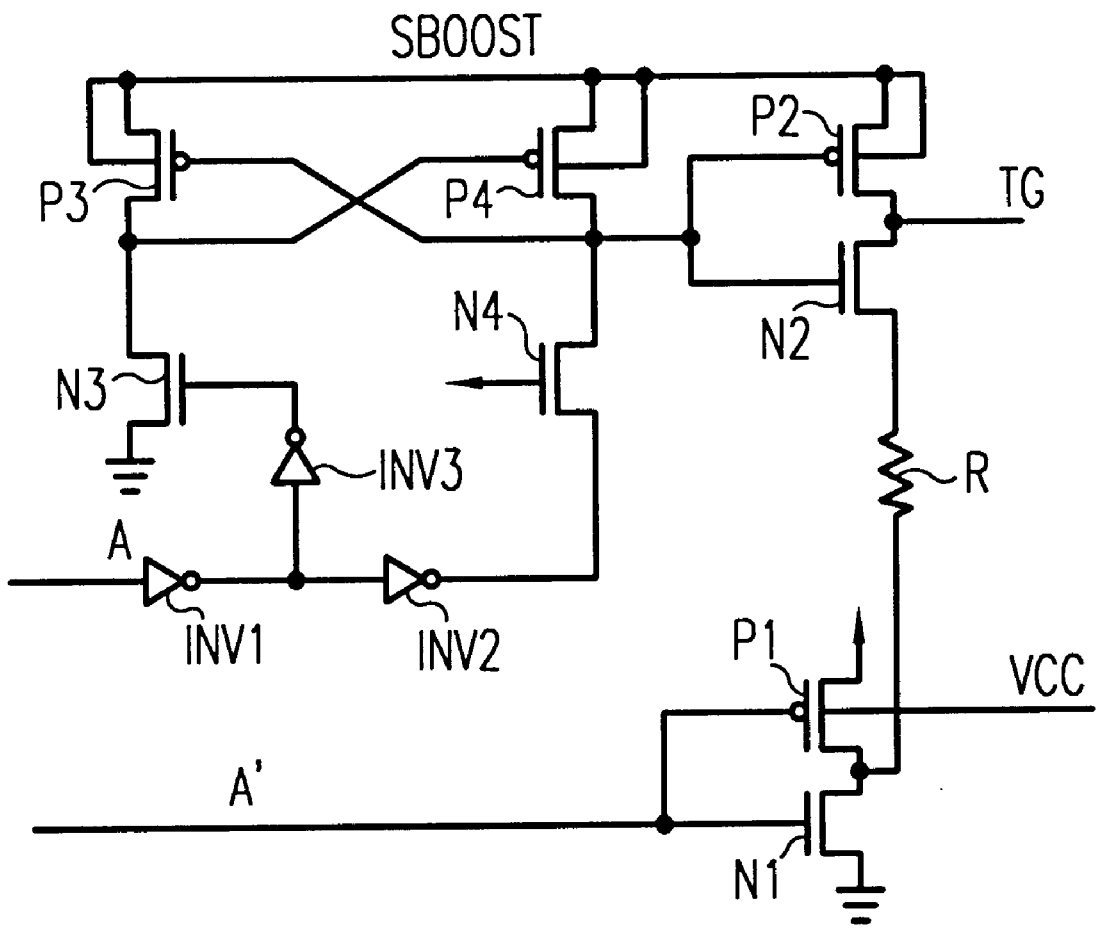
FIG. 4 is a schematic diagram showing a tri-state logic gate circuit according to a first preferred embodiment of a present invention.

FIG. 4 is a schematic diagram showing a tri-state logic gate circuit according to a first preferred embodiment of a present invention.

A tri-state logic gate circuit is circuitry formed so as to selectively output three kinds of power supply voltages including a boosted power supply voltage.

As shown in FIG. 4, the tri-state logic gate circuit is preferably made up of a first inverter circuit which selectively outputs one of the power supply voltages $V_{cc}$ and $V_{ss}$, a second inverter circuit which selectively outputs one of the first inverter circuit output and the boosted power supply voltage SBOOST, a resistor R which is inserted in an interconnection connected between the first and second inverter circuits, and a latch circuit. Here, The first inverter circuit is preferably made up of a P-channel MOS transistor P1 and an N-channel MOS transistor N1. The second inverter circuit is preferably made up of a P-channel MOS transistor P2 and an N-channel MOS transistor N2. The latch circuit is preferably made up of P-channel MOS transistors P3 and P4 and N-channel MOS transistors N3 and N4. The characteristics of a tri-state logic gate circuit are to have a resistor which is used for absorbing an electric potential difference between a source of the N-channel MOS transistor N2 and a drain of the P-channel MOS transistor P1, and apply a power supply voltage $V_{cc}$ as a back-bias.

The first preferred embodiment is performed as follow.

When an access to the memory cell is performed, an H level is applied to the reset signal A' and an L level is applied to the set signal A. At this time, the P-channel MOS transistor P1 turns off, the N-channel MOS transistor N1 turns on, the P-channel MOS transistor P2 turns on, and the N-channel MOS transistor N2 turns off. As a result, a level of a timing signal TG becomes a level of the boosted power supply voltage SBOOST.

When a precharge operation is performed after the memory access, an L level is applied to the reset signal A' and an L level is applied to the set signal. As a result, the P-channel MOS transistor P1 turns on, the N-channel MOS transistor N1 turns off, the P-channel MOS transistor P2 turns off, and the N-channel MOS transistor N2 turns on. As a result, a level of a timing signal TG becomes a level of the power supply voltage $V_{cc}$.

When the memory cells aren't selected, both of the reset signal A' and the set signal A maintain an H level. As a result, a level of a timing signal TG becomes a level of the ground potential $V_{ss}$.

The tri-state logic gate circuit of the first preferred embodiment can avoid latch-up when voltages higher than the power supply voltage $V_{cc}$ is applied to I/O pads, and turning on parasitic transistors. The reason for this is that potentials is fixed to a constant voltage by using the power supply voltage $V_{cc}$ as the back-bias. Further, in the tri-state logic gate circuit of the first preferred embodiment, an electric potential difference in a period immediately after starting the precharge operation, which is absorbed by a potential drop of the resistor R. As a result, since potentials given to a source of the P-channel transistor P1 rise almost to the level of $V_{cc}$, it can avoid problems on tolerance of the transistors.

As the mentioned above, the first preferred embodiment could be achieved the tri-state logic gate circuit difficult to occur latch-up.

A semiconductor integrated circuit device according to a second preferred embodiment of a present invention will hereinafter be described in detail with reference to FIG. 5.

Figure 5:
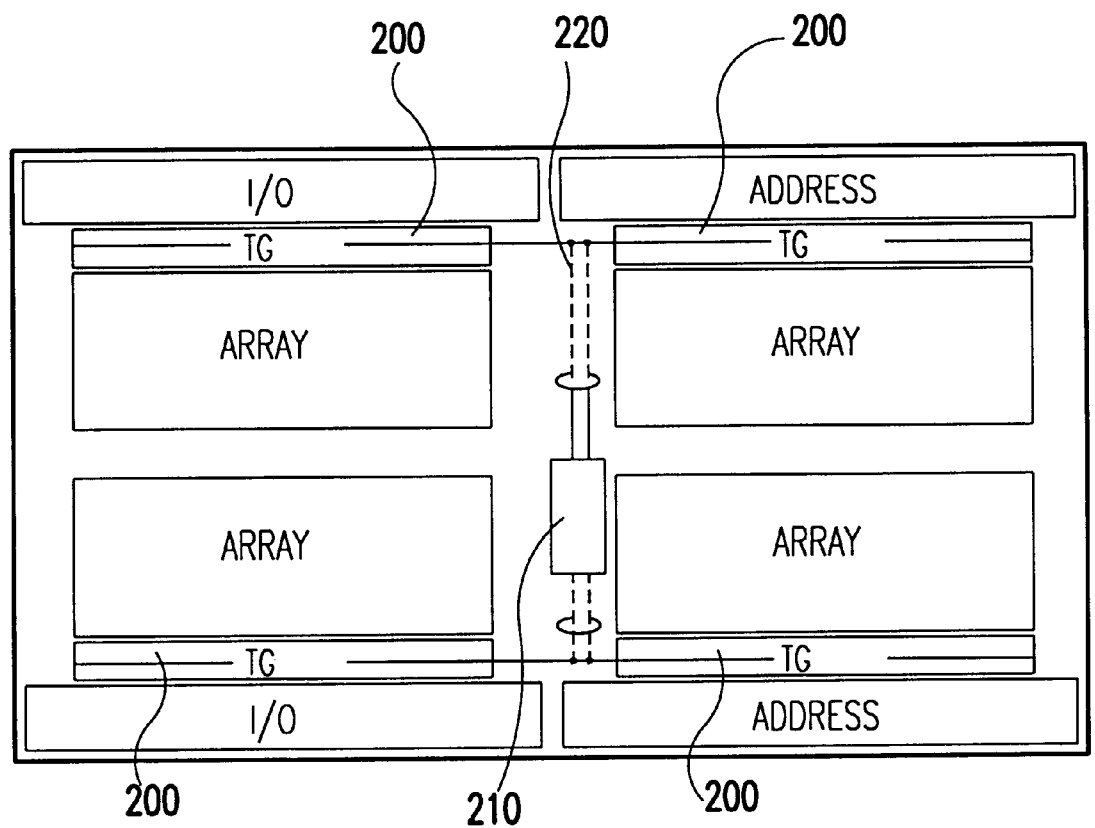
FIG. 5 is a schematic diagram showing circuitry according to a second preferred embodiment of a present invention.

FIG. 5 is a schematic diagram showing circuitry according to a second preferred embodiment of a present invention.

Figure 1:
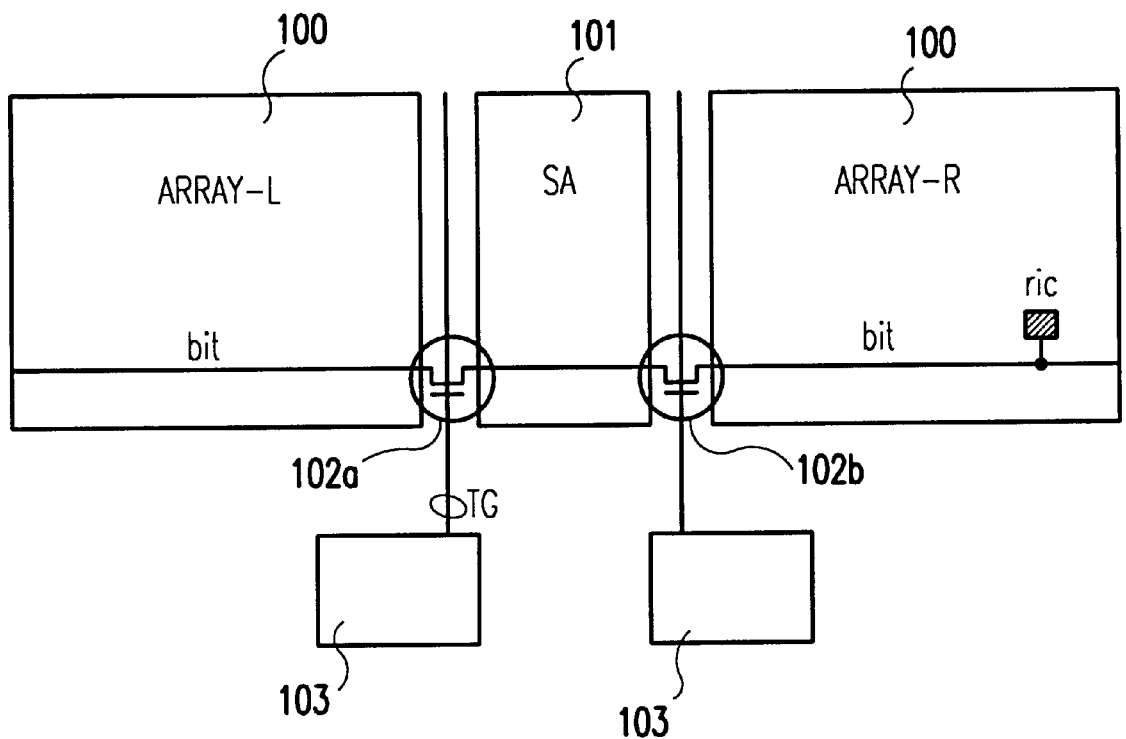
FIG. 1 is a schematic diagram showing circuitry according to a conventional DRAM circuit.
Figure 2:
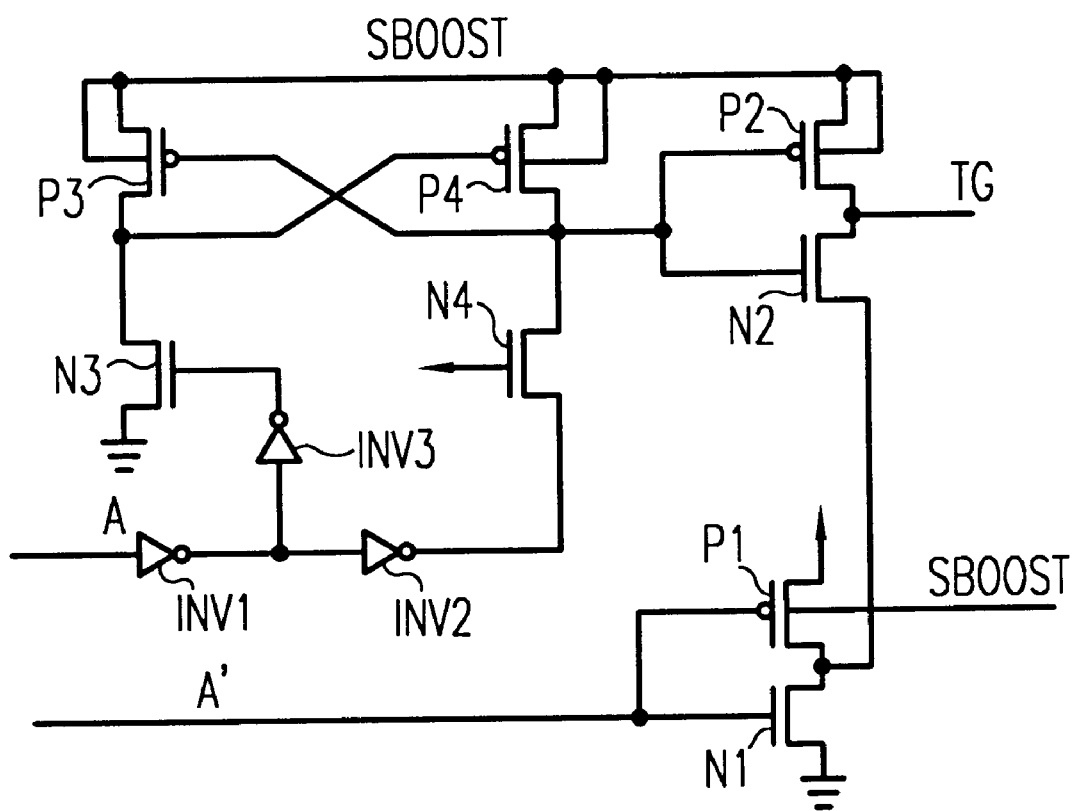
FIG. 2 is a schematic diagram showing a tri-state logic gate circuit according to a conventional DRAM circuit.
Figure 3:
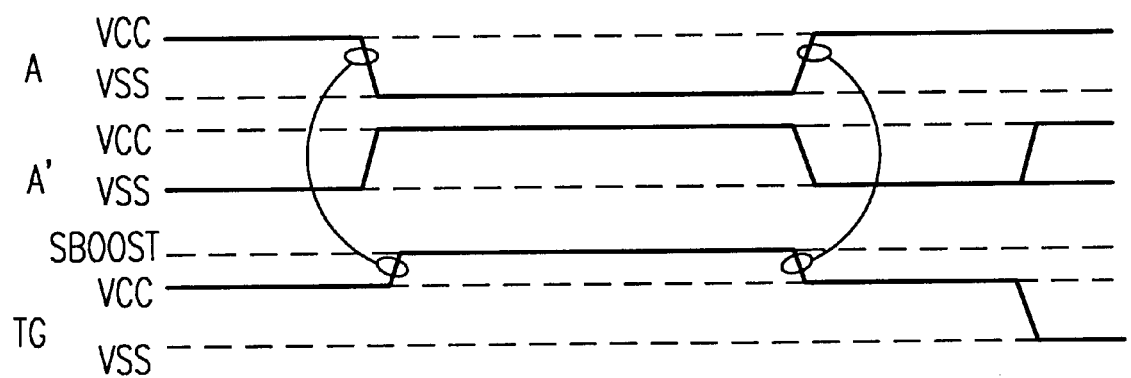
FIG. 3 is a timing chart showing an operation of a tri-state logic gate circuit according to a conventional DRAM circuit.

In the second preferred embodiment, a back-bias pump circuit 210 is shown for generating back-biases. The back-bias pump circuit 210 is connected to the tri-state logic gate circuit 200 by two interconnections 220 having same line width. Here, the tri-state logic gate circuit 200 could be using the circuitry of the first preferred embodiment. The back-bias pump circuit 210 could use a well-known circuit. As a result, the second preferred embodiment can decrease the resistivity of interconnections 220 for supplying the back-bias to the tri-state logic gate circuit 200. Therefore, the second preferred embodiment can avoid that the voltage down of the back-bias is caused by turning on parasitic transistors which is created between the first and second inverter circuits (as shown in FIG. 1).

As mentioned above, the second preferred embodiment can avoid latch-up.

A semiconductor integrated circuit device according to a third preferred embodiment of a present invention will hereinafter be described in detail with FIG. 6.

Figure 6:
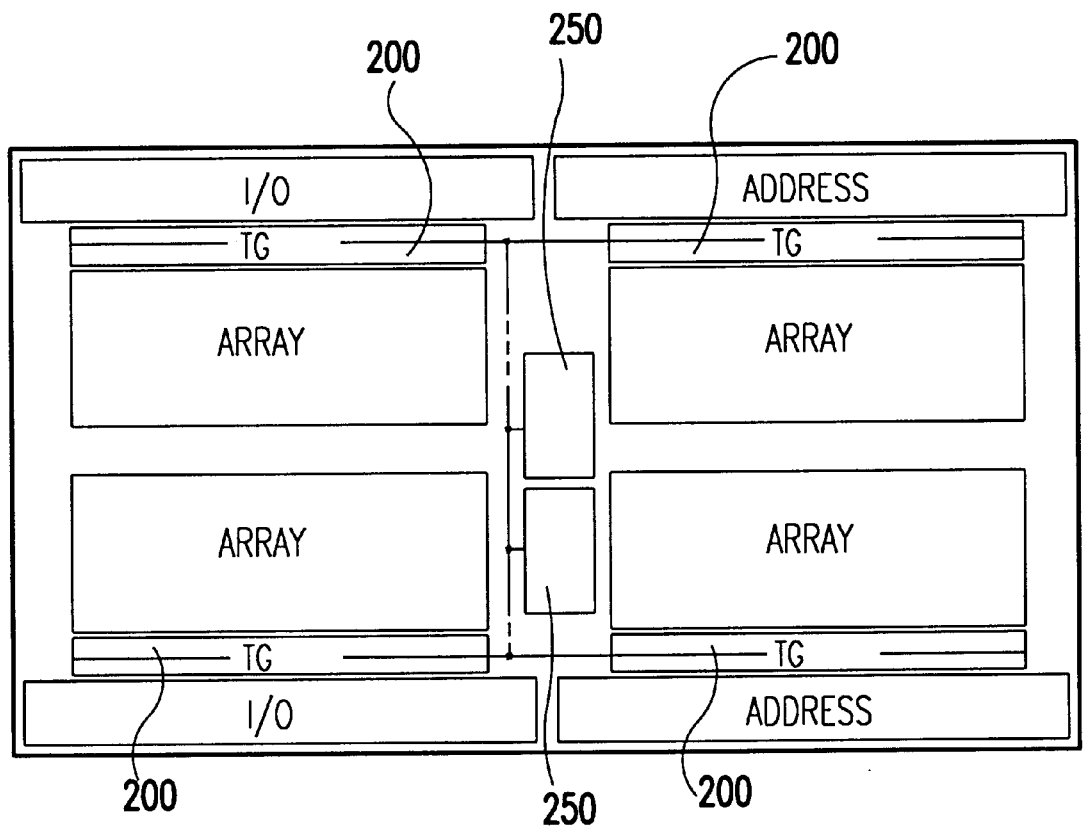
FIG. 6 is a schematic diagram showing circuitry according to a third preferred embodiment of a present invention.

FIG. 6 is a schematic diagram showing circuitry according to a third preferred embodiment of a present invention.

The third preferred embodiment has plural back-bias pump circuits, for example two back-bias pump circuits 250 for generating back-biases. Here, the plural back-bias pump circuits 250 could use well-known circuits. As a result, the third preferred embodiment could improve the capacity for supplying the back-bias. Therefore, the third preferred embodiment could avoid the fact that the voltage down of the back-bias is caused by turning on parasitic transistors which is created between the first and second inverter circuits (as shown in FIG. 1). Here, the tri-state logic gate circuit 200 could use the circuitry of the first preferred embodiment.

As mentioned above, the third preferred embodiment can avoid latch-up.

A semiconductor integrated circuit device according to a fourth preferred embodiment of a present invention will hereinafter be described in detail with FIG. 7.

Figure 7:
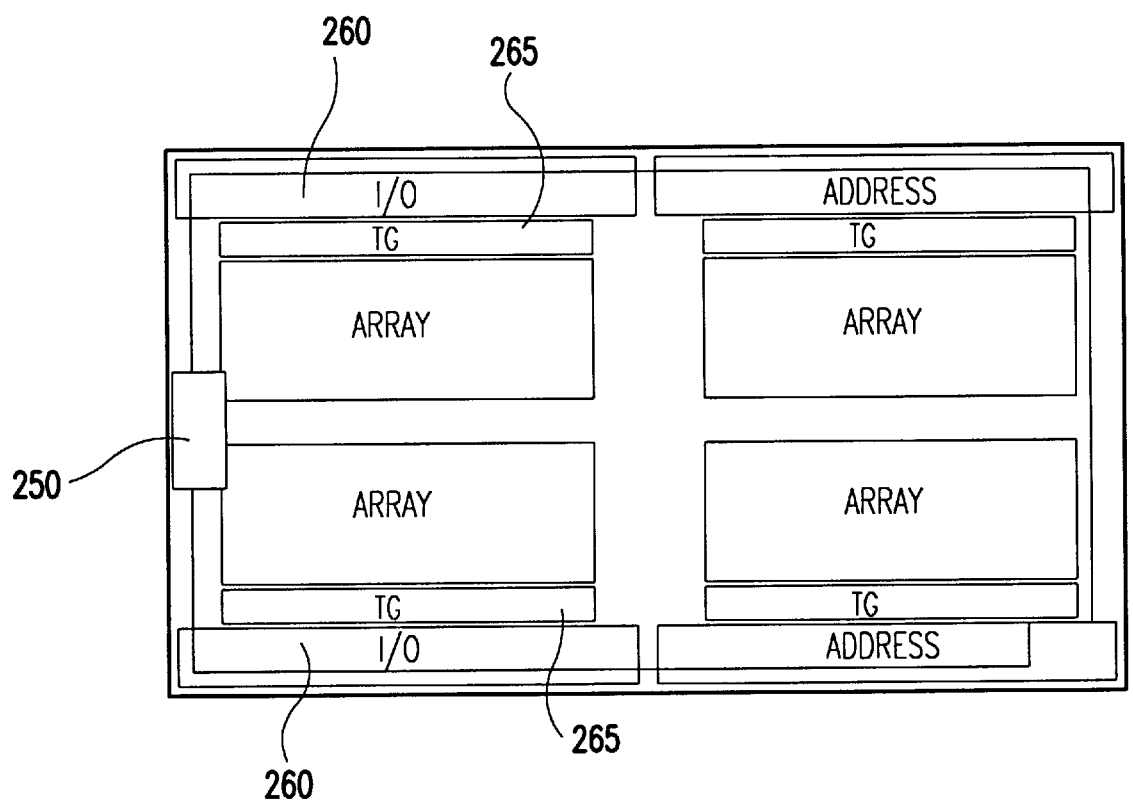
FIG. 7 is a schematic diagram showing circuitry according to a fourth preferred embodiment of a present invention.

FIG. 7 is a schematic diagram showing circuitry according to a fourth preferred embodiment of a present invention.

The fourth preferred embodiment is preferably formed so as to arrange back-bias pump circuits 250 for generating back-biases near an I/O portion 260. Here, the back-bias pump circuits 250 could use well-known circuits. As a result, the fourth preferred embodiment can avoid to rise a level of the back-bias. Further, the back-bias pump circuits 250 is arranged in center between I/O portions 260. As a result, the fourth preferred embodiment can avoid the fact that the voltage down of the back-bias is caused by turning on parasitic transistors which is created between the first and second inverter circuits (as shown in FIG. 1) even if a voltage higher than power supply voltage $V_{cc}$ is applied to the I/O portions 260. Here, the tri-state logic gate circuit 265 could be used the circuitry of the first preferred embodiment.

As mentioned above, the fourth preferred embodiment can avoid latch-up.

A semiconductor integrated circuit device according to a fifth preferred embodiment of a present invention will hereinafter be described in detail with FIG. 8.

Figure 8:
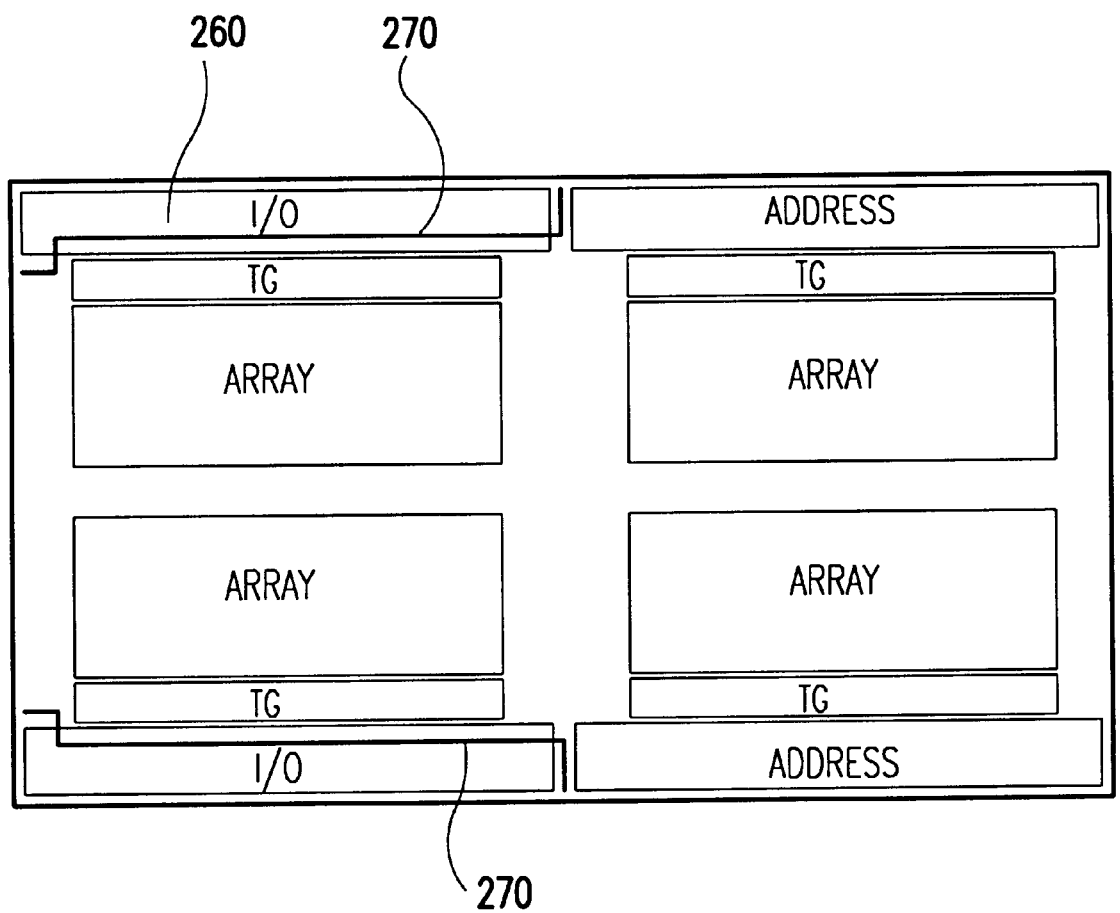
FIG. 8 is a schematic diagram showing circuitry according to a fifth preferred embodiment of a present invention.

FIG. 8 is a schematic diagram showing a circuitry according to a fifth preferred embodiment of a present invention.

The fifth preferred embodiment was formed a guard-ring 270 so as to surround I/O portions 260. Here, the guard-ring 270 is fixed to a power supply voltage $V_{cc}$ or a grand potential $V_{ss}$. As a result, the fifth preferred embodiment can avoid to rise level of a back-bias. Therefore, by flowing currents flowed from the I/O portions 260 to the guard-ring 270, the level of the back-bias could be prevented from rising. Therefore, the fifth preferred embodiment could be avoided that the voltage down of the back-bias is caused by turning on parasitic transistors which is created between the first and second inverter circuits (as shown in FIG. 1). Here, the tri-state logic gate circuit 265 could use the circuitry of the first preferred embodiment.

As mentioned above, the fifth preferred embodiment can avoid latch-up.

A semiconductor integrated circuit device according to a sixth preferred embodiment of a present invention will hereinafter be described in detail with FIG. 9.

Figure 9:
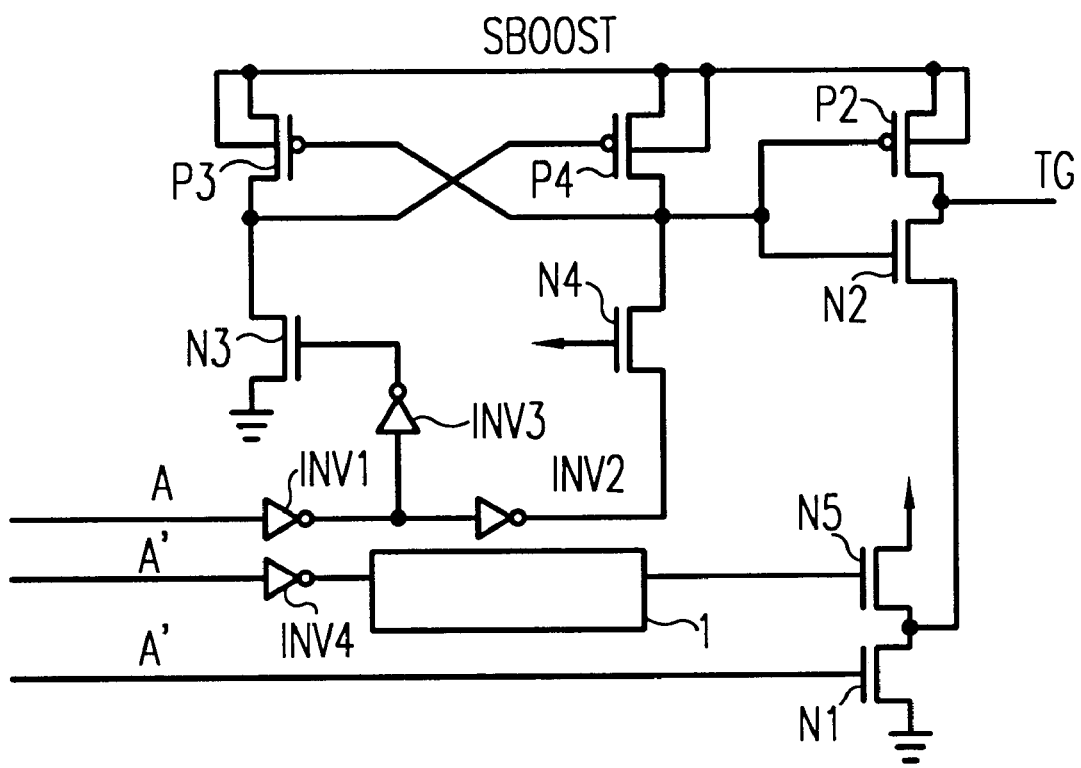
FIG. 9 is a schematic diagram showing a tri-state logic gate circuit according to a sixth preferred embodiment of a present invention.

FIG. 9 is a schematic diagram showing a tri-state logic gate circuit according to a sixth preferred embodiment of a present invention. As shown in FIG. 9, the sixth preferred embodiment is preferably made up of first and second inverter circuits and a latch circuit. The first inverter circuit includes N-channel MOS transistors N1 and N5. The second inverter circuit includes a P-channel MOS transistor P2 and an N-channel MOS transistor N2. The latch circuit includes P-channel MOS transistors P3 and P4 and N-channel MOS transistors N3 and N4. The sixth preferred embodiment includes the N-channel transistor N5 instead of the P-channel MOS transistor P1 (as shown in FIG. 1) for switching between a power supply voltage $V_{cc}$ and a groung potential $V_{ss}$. Here, the N-channel transistor N5 is applied $V_{BB}$ as a back-bias. The sixth preferred embodiment includes a level shift circuit 1 for driving the N-channel transistor N5 and includes an inverter circuit INV4 for complimentary operating the MOS transistors N1 and N5. Therefore, The sixth preferred embodiment adopts the circuitry of a push-pull inverter. A pair of N-channel MOS transistors N1 and N5 operate as a push-pull stage. Voltages boosted by the level shift circuit 1 are applied to a gate of the N-channel MOS transistor N5. The level shift circuit 1 is used for avoid that a potential of a timing signal TG becomes lower than a threshold voltage Vt because of that voltages the threshold voltage Vt lower than a gate potential of the N-channel MOS transistor N5 appears on a source of the N-channel MOS transistor N5. Therefore, the level shift circuit 1 outputs a boosted power supply voltage SBOOST boosted to $V_{cc}+Vt+\alpha$.

The sixth preferred embodiment operates as follow.

When an access to the memory cell operates, an H level is applied to the reset signal A' and an L level is applied to the set signal A. At this time, the N-channel MOS transistor N5 turns off and the N-channel MOS transistor N1 turns on. On the other hand, the P-channel MOS transistor P2 turns on and an N-channel MOS transistor N2 turns off. As a result, a level of a timing signal TG becomes a level of the boosted power supply voltage SBOOST.

During a precharge operation, an L level is applied to the reset signal A' and an H level is applied to the set signal A. At this time, the N-channel MOS transistor N5 turns on and the N-channel MOS transistor N1 turns off. On the other hand, the P-channel MOS transistor P2 turns off and an N-channel MOS transistor N2 turns on. As a result, a level of a timing signal TG becomes a level of the power supply voltage $V_{cc}$.

When the memory cells aren't selected, an H level is applied to both of the reset signal A'. As a result, a level of a timing signal TG becomes a level of the ground potential $V_{ss}$.

As mentioned above, the sixth preferred embodiment doesn't present parasitic transistors, and therefore it can avoid a latch-up.

Figure 10:
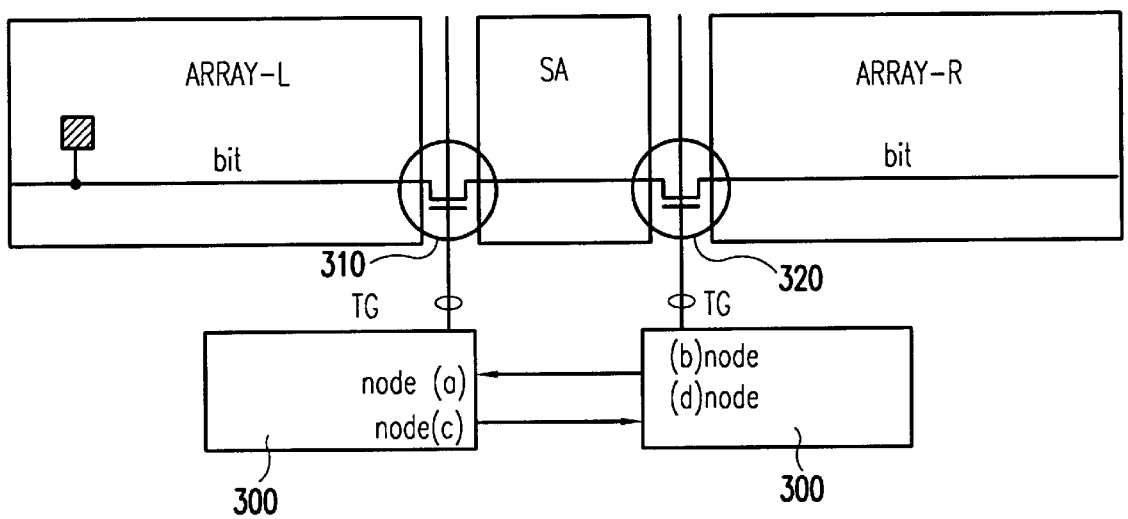
FIG. 10 is a schematic diagram showing circuitry according to a seventh preferred embodiment of a present invention.
Figure 11:
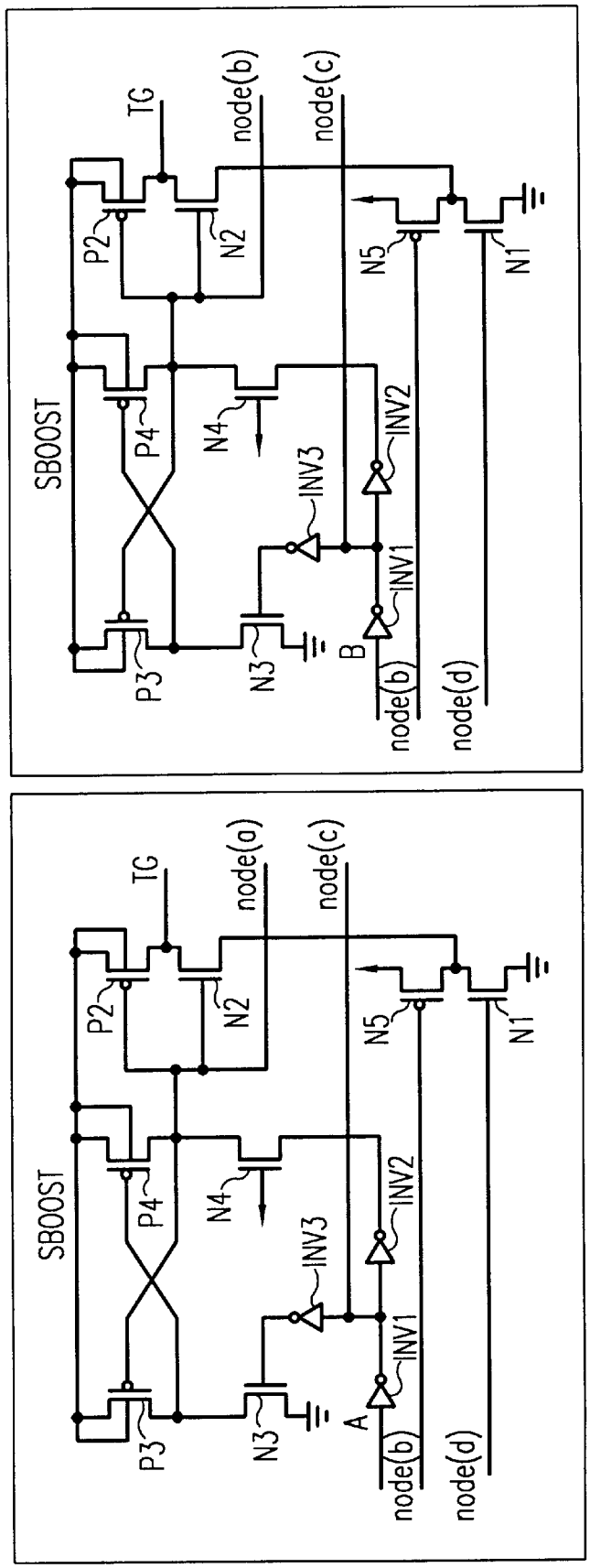
FIG. 11 is a schematic diagram showing a tri-state logic gate circuit according to a seventh preferred embodiment of a present invention.

FIG. 10 is a schematic diagram showing a circuitry according to a seventh preferred embodiment of the present invention. FIG. 11 is a schematic diagram showing a tri-state logic gate circuit according to a seventh preferred embodiment of a present invention.

As shown in FIGS. 10 and 11, a seventh preferred embodiment is preferably made up of a pair of tri-state logic gate circuits 300. The pair of the tri-state logic gate circuits 300 include first and second inverter circuits and a latch circuit, respectively. The first inverter circuit includes N-channel MOS transistors N1 and N5. The second inverter circuit includes a P-channel MOS transistor P2 and an N-channel MOS transistor N2. The latch circuit includes P-channel MOS transistors P3 and P4 and N-channel MOS transistors N3 and N4. The seventh preferred embodiment includes a pair of tri-state logic gate circuits 300 arranged so as to symmetrize a sense amplifier SA and which characterizes to apply control signals each other between the pair of tri-state logic gate circuits 300. Further, the seventh preferred embodiment is different from the sixth preferred embodiment in disusing the level shift circuit 1 for applying the boosted power supply voltage SBOOST to N-channel MOS transistors N5. The reason for this is that the seventh preferred embodiment is constructed so as to supply a boosted power supply voltage SBOOST for driving the N-channel MOS transistors N5 from node (a) (or (b)) of the other tri-state logic gate circuit 300, and so as to supply a driving signal for an N-channel MOS transistor N1 for switching between a power supply voltage $V_{cc}$ and a ground potential $V_{ss}$ from node (c) (or (d)) the other tri-state logic gate circuit 300. Here, the node (a) (or (b)) is connected among a drain of a P-channel MOS transistor P4 and a drain of an N-channel MOS transistor N4, generates the boosted power supply voltage SBOOST when a set signal A (or B) is an H level, and generates a groung potential $V_{ss}$ when a set signal A (or B) is an L level. The node (c) (or (d)) is connected to an output of an inverter INV1, generates an L level ($V_{cc}$) when the set signal A (or B) is an H level, and generates a ground potential $V_{ss}$ when the set signal A (or B) is an L level.

As mentioned above, the seventh preferred embodiment can avoid latch-up because of using voltage generated in an inner circuit as the driving signal, and could be improved a simplified circuitry.

Figure 12:
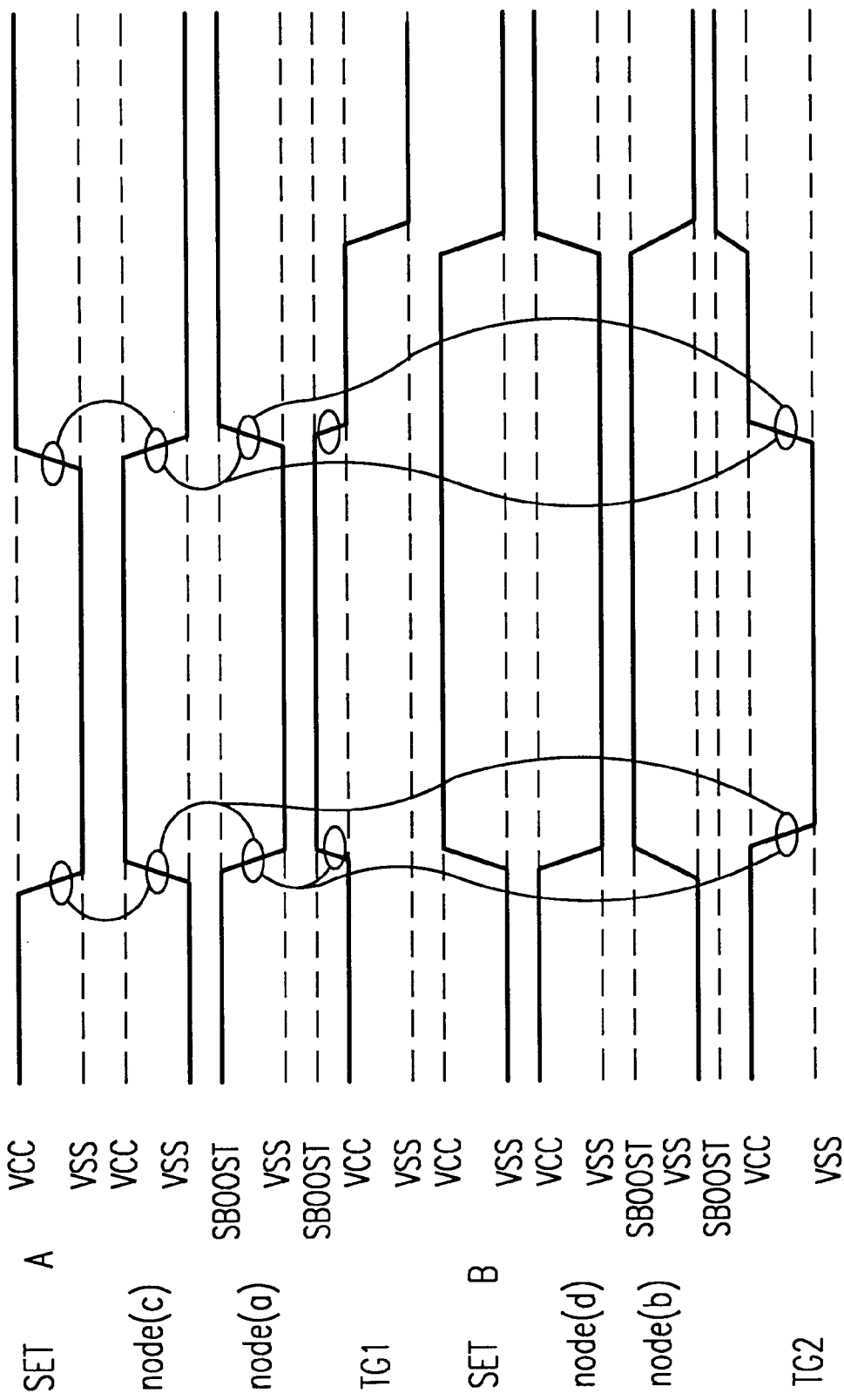
FIG. 12 is a timing chart showing an operation of a tri-state logic gate circuit shown in FIG. 11.

FIG. 12 is a timing chart showing an operation of a tri-state logic gate circuit shown in FIG. 11. The tri-state logic gate circuits 300 operate as follow.

When an access to memory array ARRAY-L connected to an N-channel transfer gate 310 is performed, an L level is applied to the set signal A and a H level ($V_{cc}$) is applied to the set signal B. At this time, a ground potential $V_{ss}$ appears on the node (a), the N-channel MOS transistor N2 turns off, the P-channel MOS transistor P2 turns on. As a result, the boosted power supply voltage SBOOST appears on a timing signal TG1. On the other hand, a timing signal TG2 outputted from the other tri-state logic gate circuit 300, which becomes a ground potential $V_{ss}$ since a node (a) is an L level and node (b) and (c) are an H level. Therefore, the timing signal TG2 charge to a non-selected state.

During a precharge operation, an H level is applied to both of the set signals A and B and an H level is applied to the set signal B for driving the other tri-state logic gate circuit 300. At this time, the node (a) and (b) are an H level, the N-channel MOS transistor N2 turns on, and the P-channel MOS transistor P2 turns off. As a result, the power supply voltage $V_{cc}$ appears on the timing signals TG1 and TG2 via the N-channel MOS transistor N5 since the node (c) and (d) are an L level.

When a memory array connected to an N-channel transfer gate 310 isn't selected, an H level is applied to the set signal A and an L level is applied to the set signal B for driving the other tri-state logic gate circuit 300. As a result, the timing signal TG2 becomes the boosted power supply voltage SBOOST.

As mentioned above, the seventh preferred embodiment doesn't present parasitic transistors, and therefore it can avoid latch-up.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention. For example, the sixth and seventh preferred embodiment don't show interconnections connected between the first and second inverter circuits, but they may use such interconnections. Further, each of the preferred embodiment has described as the tri-state logic gate circuit of the DRAM, but they may be apply to an another circuits using a boosted power supply voltage to a gate instead of the DRAM, for example may be apply to a word driver circuit or a data output circuit. Further, each of the preferred embodiment has described using MOS transistors, but they may be used MES FET. Further, each of the preferred embodiment may be combined the second and third preferred embodiments and combined the second and fourth preferred embodiment.

What is claimed is:

1. A tri-state logic gate circuit comprising:
   a first inverter circuit selectively outputting one of a power supply voltage and a ground potential;
   a second inverter circuit selectively outputting one of an output of the first inverter circuit and a boosted power supply voltage;
   a resistor connected between the first and second inverter circuits;
   a negative voltage generating circuit; and
   an input/output circuit arranged near the negative voltage generating circuit.

2. A tri-state logic gate circuit as claimed in claim 1, wherein the first inverter circuit comprises CMOS circuitry.

3. A tri-state logic gate circuit as claimed in claim 2, wherein the CMOS circuitry including a P-channel MOS transistor which is supplied an power supply voltage to a back-bias thereof.

4. A tri-state logic gate circuit as claimed in claim 3, wherein the power supply voltage is an external power supply voltage.

5. A tri-state logic gate circuit as claimed in claim 4, wherein the back-bias supply source providing plural supply source per supply line.

6. A tri-state logic gate circuit as claimed in claim 1, wherein the input/output circuit is surrounded by a guard ring.

7. A tri-state logic gate circuit comprising:
   a first inverter circuit being a bootstrap circuitry, the first inverter circuit selectively outputting one of a power supply voltage and a ground potential;
   a second inverter circuit selectively outputting one of an output of the first inverter circuit and a boosted power supply voltage;
   a negative voltage generating circuit; and
   an input/output circuit arranged near the negative voltage generating circuit.

8. A tri-state logic gate circuit as claimed in claim 7, wherein the first inverter circuit comprises a pair of N-channel transistors.

9. A tri-state logic gate circuit as claimed in claim 8, further comprising:
   a level shift circuit which drives one of the pair of N-channel transistors; and
   a third inverter which complimentary operates the pair of N-channel transistors.

10. A tri-state logic gate circuit comprising:
    a latch circuit;
    a first inverter circuit selectively outputting one of a power supply voltage and a ground potential;
    a second inverter circuit selectively outputting one of an output of the first inverter circuit and a boosted power supply voltage and inputting an output of the latch circuit;
    a resistor connected between the first and second inverter circuits;
    a negative voltage generating circuit; and
    an input/output circuit arranged near the negative voltage generating circuit.

11. A tri-state logic gate circuit as claimed in claim 10, wherein the first inverter circuit comprises CMOS circuitry.

12. A tri-state logic gate circuit as claimed in claim 11, wherein the CMOS circuitry including a P-channel MOS transistor which is supplied a power supply voltage to a back-bias thereof.

13. A tri-state logic gate circuit as claimed in claim 12, wherein the power supply voltage is an external power supply voltage.

14. A tri-state logic gate circuit as claimed in claim 13, wherein the back-bias supply source providing plural supply source per supply line.

15. A tri-state logic gate circuit as claimed in claim 10, wherein the input/output circuit is surrounded by a guard ring.

16. A pair of tri-state logic gate circuit comprising:

a first tri-state logic gate circuit including a first inverter circuit selectively outputting one of a power supply voltage and a ground potential, a second inverter circuit selectively outputting one of an output of the first inverter circuit and a boosted power supply voltage, a negative voltage generating circuit, and an input/output circuit arranged near the negative voltage generating circuit;

a second tri-state logic gate circuit including a third inverter circuit selectively outputting one of a power supply voltage and a ground potential, a fourth inverter circuit selectively outputting one of an output of the first inverter circuit and a boosted power supply voltage, a negative voltage generating circuit, and an input/output circuit arranged near the negative voltage generating circuit;

the first inverter circuit operating using a driving signal of the fourth inverter circuit; and the third inverter circuit operating using a driving signal of the second inverter circuit.

17. A tri-state logic gate circuit as claimed in claim 7, wherein the input/output circuit is surrounded by a guard ring.

18. A pair of tri-state logic gate circuits as claimed in claim 16, wherein each input/output circuit is surrounded by a guard ring.

* * * * *